United States Patent [19]

Smith

[11] Patent Number: 6,097,225
[45] Date of Patent: Aug. 1, 2000

[54] MIXED SIGNAL CIRCUIT WITH ANALOG CIRCUITS PRODUCING VALID REFERENCE SIGNALS

[75] Inventor: Gregory J. Smith, Tucson, Ariz.

[73] Assignee: National Semiconductor Corporation, Santa Clara, Calif.

[21] Appl. No.: 09/115,410

[22] Filed: Jul. 14, 1998

[51] Int. Cl.[7] ...................................................... H03L 7/00
[52] U.S. Cl. ............................................ 327/143; 327/198
[58] Field of Search ..................................... 327/142, 143, 327/198, 205, 199, 206

[56] References Cited

U.S. PATENT DOCUMENTS

| | | | |
|---|---|---|---|
| 5,109,187 | 4/1992 | Guliani | 323/313 |
| 5,144,159 | 9/1992 | Frisch et al. | 327/198 |
| 5,214,316 | 5/1993 | Nagai | 307/272.3 |
| 5,304,918 | 4/1994 | Khieu | 323/315 |
| 5,323,067 | 6/1994 | Shay | 307/272.3 |
| 5,469,099 | 11/1995 | Konishi | 327/198 |
| 5,497,112 | 3/1996 | Hoang | 327/143 |
| 5,617,048 | 4/1997 | Ward et al. | 327/143 |
| 5,638,330 | 6/1997 | Confalonieri et al. | 327/143 |
| 5,686,847 | 11/1997 | Stubbe et al. | 327/143 |
| 5,691,621 | 11/1997 | Phuoc et al. | 320/31 |
| 5,936,443 | 8/1999 | Yasuda et al. | 327/143 |

*Primary Examiner*—Jung Ho Kim
*Attorney, Agent, or Firm*—Skjerven,Morrill,MacPherson,Franklin and Friel

[57] ABSTRACT

A validity circuit is used with an analog circuit in a mixed signal system to determine whether the supply voltage is at an adequate voltage level to assure stable operation of the analog circuit. The validity circuit generates a "valid" signal that is used to activate the mixed signal system when the voltage level of the supply voltage is adequate. Where the voltage level of the supply voltage is inadequate to produce a stable output signal from the analog circuit, the analog circuit will stop generating a valid signal indicating that any output signal generated by the analog signal is unstable. The logic circuit is thus deactivated to avoid producing inaccurate or unreliable results. Where the analog circuit is a bandgap voltage reference circuit, the validity circuit is connected to two nodes within the feedback loop of the bandgap voltage reference circuit. By comparing the voltage levels of the two nodes, the validity circuit can determine when the feedback loop is going into an overdrive condition indicating that the supply voltage is no longer adequate to maintain a linear output signal from the bandgap voltage reference circuit. Each sub-system of the mixed signal system may have a separate validity circuit to individually determine if the supply voltage is adequate for that sub-system to produce a stable output signal. The valid signals generated by each validity circuit are received by a logic gate that appropriately activates or deactivates the mixed signal system.

18 Claims, 5 Drawing Sheets

MIXED SIGNAL CIRCUIT WITH ANALOG CIRCUITS PRODUCING VALID REFERENCE SIGNALS

FIELD OF THE INVENTION

The present invention relates to a voltage reference circuit that provides a valid reference signal indicating that the voltage reference circuit is stable, and more particularly, the present invention relates to a mixed signal system in which each subsystem independently generates a valid signal.

BACKGROUND

Mixed signal integrated circuits require a steady power supply. When the voltage level of the supply voltage drops below an operating level, the integrated circuit will malfunction. Thus, it is important to monitor the voltage level of the supply voltage so that the device may be deactivated prior to malfunctioning.

Commonly a power-on-reset (POR) circuit is used to monitor the supply voltage and to predict when the voltage level of the supply voltage is adequate to assure proper operation of the system components of the mixed signal circuit. The POR circuit provides a signal that deactivates the mixed signal circuit when the supply voltage is below a threshold level.

FIG. 1 is a diagram illustrating a conventional integrated mixed signal system 10, including a POR circuit 12, a logic circuit 14, and a supply voltage Vdd powering four analog circuits 16, 18, 20, and 22 as well as POR circuit 12. Analog circuits 16–22 may be voltage references, system clocks, amplifiers and other such system components. It is understood, of course, that the analog circuits and logic circuit shown in FIG. 1 are illustrative and that mixed signal system 10 may have many additional analog circuits and logic circuits powered by supply voltage Vdd.

Analog circuits 16–22 receive and transmit analog signals "a" from external and/or internal devices (not shown), and provide and receive digital signals d to logic circuit 14. Logic circuit 14 provides a digital signal d to an external device (not shown) such as another logic circuit or an output interface.

As shown in FIG. 1, POR circuit 12 is connected directly to the supply voltage Vdd. The POR circuit 12 provides a digital signal d to logic circuit 14, which is a "deactivate signal" indicating when supply voltage Vdd is below a threshold voltage level. The threshold voltage level is the minimum threshold for proper operation of all system components. Logic circuit 14 is deactivated when it receives the deactivate signal from POR circuit 12 so that mixed signal system 10 does not operate when the voltage level of supply voltage Vdd is below the threshold voltage level. Of course, POR circuit 12 may alternatively produce an "activate signal" to activate logic circuit 14 when supply voltage Vdd is adequate to power all system components of mixed signal circuit 10.

As shown in FIG. 1, POR circuit 12 is external to logic circuit 14 and analog circuits 16–22. Because POR circuit 12 directly monitors supply voltage Vdd without input from the actual system components, i.e., analog circuits 16–22, POR circuit 12 must predict when supply voltage Vdd is inadequate to power these system components. Thus, POR circuit 12 uses a preselected voltage range within which supply voltage Vdd is permitted to vary. When POR circuit 12 detects the voltage level of supply voltage Vdd varying beyond the preselected voltage range, the deactivate signal is triggered.

Because POR circuit 12 does not receive input from other system components, the voltage range within which supply voltage Vdd may vary is preselected such that all system components are assured to have sufficient power to operate properly. However, the appropriate voltage range for some of the components of mixed signal system 10 may be different from other components, particularly where a component is more temperature dependent than other components. Further, the appropriate voltage range may vary from one mixed signal system to the next due to process variances. Thus, to assure that the deactivate signal produced by POR circuit 12 occurs at a voltage level that is sufficient to power all system components, a usable voltage range is typically sacrificed. In other words, the minimum supply voltage Vdd level permitted by POR circuit 12 is greater than is actually necessary to power the system components. However, as technological improvements permit the magnitudes of supply voltages to decrease, it is increasingly important to minimize sacrificed voltage ranges.

Moreover, to accurately monitor supply voltage Vdd, POR circuit 12 generally uses a voltage generator, such as a bandgap voltage reference circuit, to produce an accurate temperature independent reference voltage to compare with supply voltage Vdd. However, where one of analog circuits 16–22 is a bandgap voltage reference circuit or similar temperature independent voltage supply the use of a second bandgap voltage reference in POR circuit 12 is redundant. Thus, the cost and complexity of mixed signal system 10 is increased while valuable real estate on the integrated circuit is wasted.

SUMMARY

A mixed signal circuit uses a validity circuit to actually detect when an analog system of the mixed signal circuit is adequately powered to assure its stable operation. The validity circuit is connected to the analog circuit in the mixed signal circuit and thus does not require a prediction of the operation range of the analog circuit. The validity circuit produces a "valid" signal when the output signal from the analog circuit is stable and therefore valid. When the supply voltage no longer provides an adequate voltage to power the analog circuit, validity circuit stops producing the valid signal, or alternatively produces an "invalid" signal, indicating that operation of the analog circuit is unstable. A logic circuit in the mixed signal system is activated or deactivated in response to the valid signal.

Where a bandgap voltage reference circuit is used in a mixed signal system, a valid reference circuit is used to detect when the bandgap voltage reference circuit is adequately powered by the supply voltage. The valid reference circuit is connected to two nodes in the feedback loop of the bandgap voltage reference circuit. By comparing the voltage levels of the two nodes, the stability of the reference output signal of the bandgap voltage reference circuit can be determined. The voltage levels at the two nodes change rapidly at the onset of loop overdrive conditions, indicating that there is insufficient voltage to maintain linear operation of the output stage and that the reference output signal is unstable. The valid reference circuit translates the change of voltage levels at the two nodes into a valid reference signal that is used to activate or deactivate the logic circuit depending on stability of the operation of the bandgap voltage reference circuit.

A plurality of analog circuit may similarly use validity circuits to actually detect when the analog circuits are receiving sufficient voltage levels to assure stable operation.

Each analog circuit is, thus, connected to a separate validity circuit to independently determine whether each analog circuit is adequately powered. Each validity circuit produces a separate valid signal which is received by a logic gate, e.g., an AND logic gate. The logic gate produces a signal to appropriately activate or deactivate the logic circuit in response to the valid signals.

BRIEF DESCRIPTION OF THE DRAWINGS

The above and other features, aspects, and advantages of the present invention will become better understood with regard to the following description, appended claims, and accompanying figures, where:

DETAILED DESCRIPTION

Figure 1:
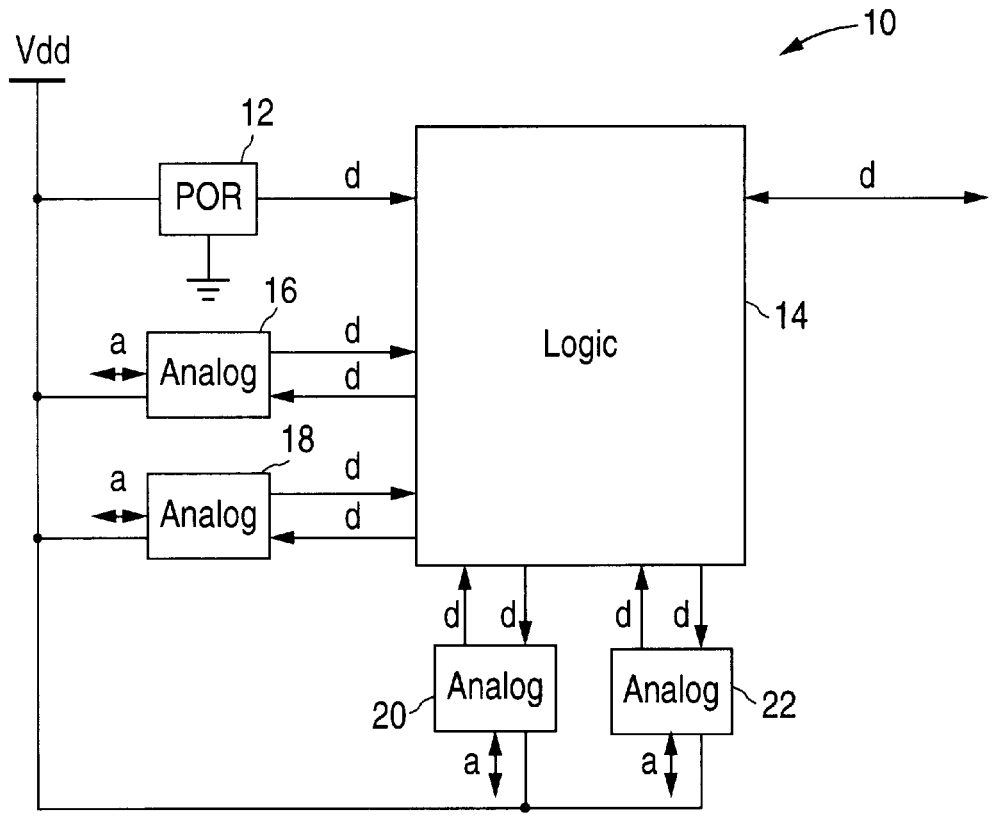
FIG. 1 is a diagram illustrating a mixed signal system, including a conventional power-on-reset circuit, a logic circuit, and four analog circuits.
Figure 2:
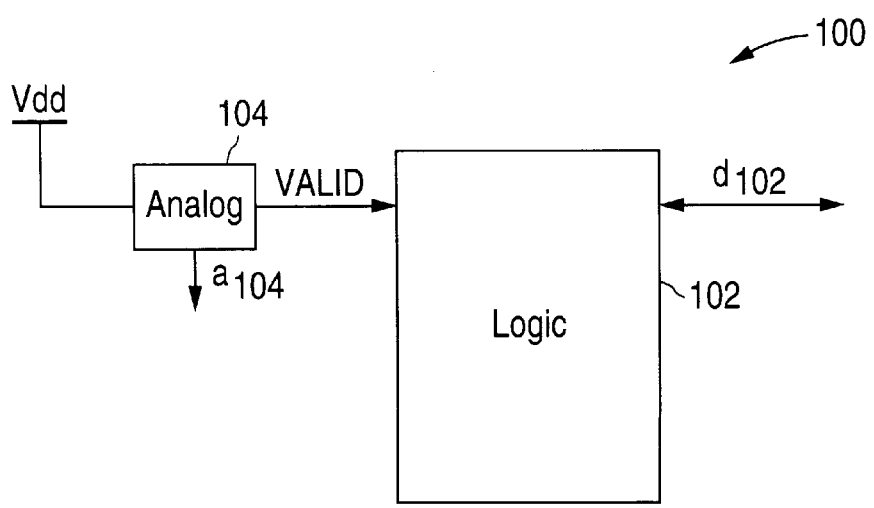
FIG. 2 is a diagram of a mixed signal system, including a logic circuit and an analog circuit providing a self-generated valid reference signal in accordance with an embodiment of the present invention.

FIG. 2 is a diagram of a mixed signal system 100 that includes a logic circuit 102 and a sub-system analog circuit 104. Analog circuit 104 provides a self generated "valid" signal to logic circuit 102 indicating whether analog circuit 104 is receiving an adequate voltage level from supply voltage Vdd. The valid signal generated by analog circuit 104 precisely tracks the actual operation of analog circuit 104 in accordance with an embodiment of the present invention and thus there is no need to use a separate circuit to predict when analog circuit 104 is adequately powered.

As shown in FIG. 2, analog circuit 104 is connected to supply voltage Vdd and logic circuit 102. Analog circuit 104 provides an analog signal via line $a_{104}$ to other analog circuits (not shown in FIG. 2). Analog circuit 104 includes a validity circuit that detects whether analog circuit 104 is receiving sufficient power from supply voltage Vdd to assure the proper operation of analog circuit 104. If supply voltage Vdd is at an adequate voltage level, the validity circuit of analog circuit 104 will generate a valid signal that is received by logic circuit 102 via line VALID. The reception of a valid signal enables the function of logic circuit 102.

If, however, supply voltage Vdd does not have an adequate voltage level to assure proper operation of analog circuit 104, the validity circuit of analog circuit 104 will not generate a valid signal or, alternatively, will generate an "invalid" signal indicating that the voltage level of supply voltage Vdd is not adequate for the proper operation of analog circuit 104. In response to receiving an "invalid" signal or not receiving a "valid" signal, the function of logic circuit 102 will be disabled. Disabling logic circuit 102 places logic circuit 102 in a state where the analog signals are not trusted and thus are not relied upon, such as during a reset state or sleep state. The particular state that logic circuit 102 is placed in when logic circuit 102 is disabled depends on the type of circuit used and the function performed by logic circuit 102.

Analog circuit 104, by way of an example, is a bandgap voltage reference circuit providing a reference output signal on line $a_{104}$. Thus, analog circuit 104 provides an analog reference output signal to other analog circuits (not shown in FIG. 2) and a self-generated valid reference signal to logic circuit 102 indicating that the reference output signal is stable or "valid." When logic circuit 102 receives a valid reference signal, mixed signal system 100 is enabled and logic circuit 102 conventionally generates a digital signal that is received by an external device (not shown) via line $d_{102}$.

On the other hand, mixed signal system 100 is disabled when logic circuit 102 does not receive a valid reference signal from analog circuit 104, indicating that analog circuit 104 is not adequately powered to operate properly. Mixed signal system 100 is disabled to avoid inaccurate or unreliable operation while analog circuit 104 is producing an unstable reference output signal.

Thus, by using a self-generated valid reference signal from analog circuit 104, mixed signal system 100 precisely tracks when analog circuit 104 is actually receiving sufficient power from supply voltage Vdd. Consequently, there is no need for a separate POR circuit to predict when analog circuit 104 will no longer be sufficiently powered to properly operate. The valid reference signal from analog circuit 104 eliminates the need to sacrifice a range of usable voltage supply to assure that mixed signal system 100 will be disabled prior to analog circuit 104 malfunctioning.

Figure 3:
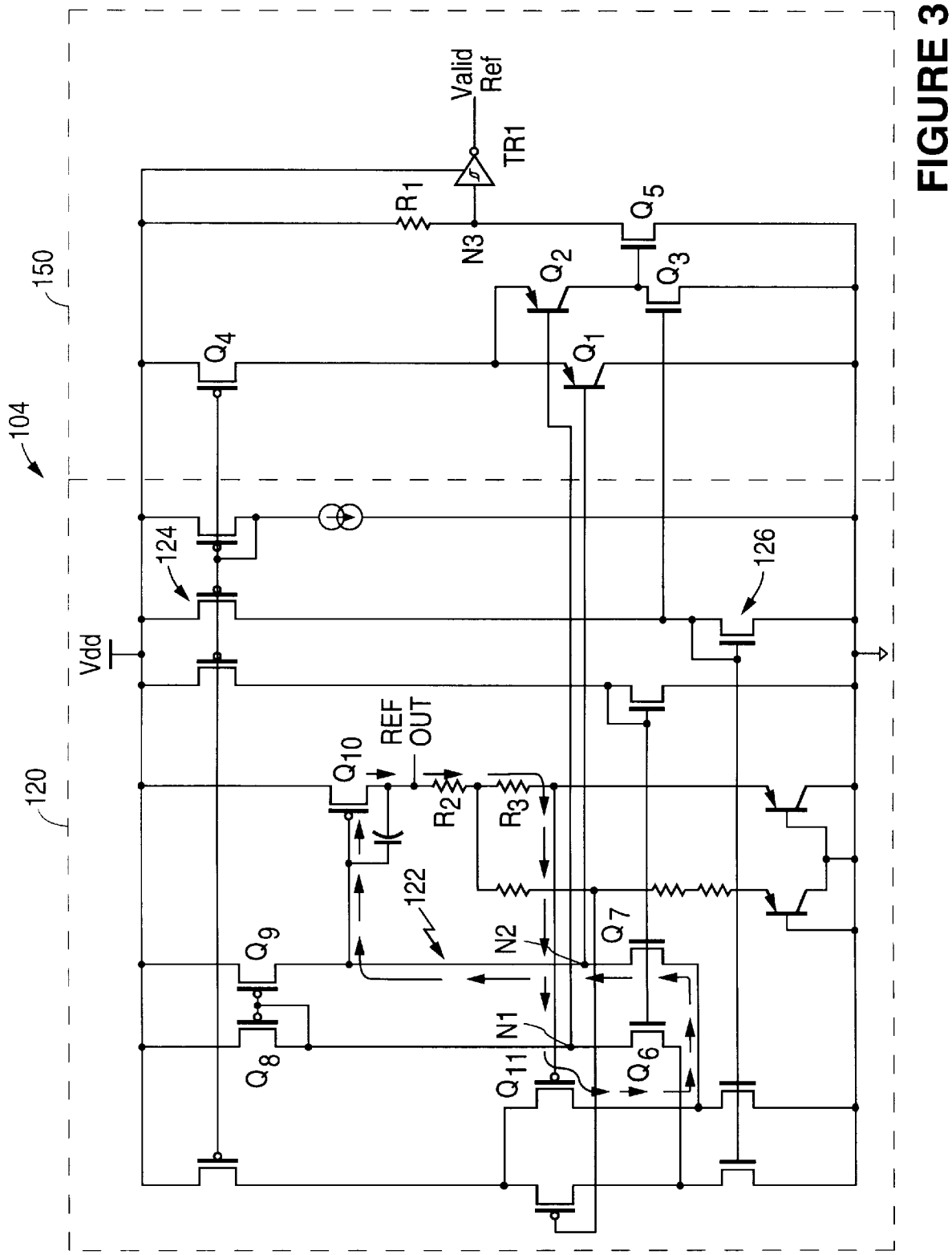
FIG. 3 is a diagram of a bandgap voltage reference circuit connected to a valid reference circuit that produces a valid reference signal in accordance with an embodiment of the present invention.

FIG. 3 is a schematic view of analog circuit 104. Analog circuit 104 includes a bandgap voltage reference circuit 120 connected to a valid reference circuit 150. Bandgap voltage reference circuit 120 may be a conventional bandgap voltage reference circuit, the operation of which is well understood by those of ordinary skill in the art.

As shown in FIG. 3, bandgap voltage reference circuit 120 is coupled to supply voltage Vdd and ground common. Bandgap voltage reference circuit 120 provides a reference output signal at terminal REF OUT, which is coupled to system analog circuits via line "$a_{104}$", shown in FIG. 2. When supply voltage Vdd is low, there is insufficient voltage to maintain linear operation of the transistors Q6 and Q7 connected to nodes N1 and N2 in bandgap voltage reference circuit 120. Consequently, the high-gain feedback stage 122 as illustrated by the arrows is overdriven, which will result in significant errors in the reference output signal at terminal REF OUT. The differential voltages at nodes N1 and N2 in feedback stage 122 change rapidly at the onset of overdrive conditions.

As illustrated by the arrows, high-gain feedback stage 122 includes transistor Q10, resistors R2 and R3, transistor Q11, and transistor Q7. Transistor Q7 is connected to transistor Q10 via node N2. Nodes N1 and N2 are connected to supply voltage Vdd via respective transistors Q8 and Q9.

To detect when supply voltage Vdd is too low to produce a stable reference output signal from bandgap voltage reference circuit, valid reference circuit 150 is connected to high-gain feedback stage 122 at node N2 as well as node N1 so that valid reference circuit 150 can detect when high-gain feedback stage 122 is transitioning into overdrive.

Valid reference circuit 150 includes pnp bipolar transistors Q1 and Q2. The base of transistor Q2 is connected to node N1, while the base of transistor Q1 is connected to node N2. The collector of transistor Q1 is connected directly to ground common and the collector of transistor Q2 is connected to the drain of transistor Q3, which is an n-channel MOSFET biased as a current source. The emitters of transistors Q1 and Q2 are tied together and are connected to the drain of transistor Q4, which is a p-channel MOSFET, also biased as a current source. The current through transistor Q4 is greater than the current through transistor Q3.

The source of transistor Q4 is connected directly to supply voltage Vdd, while its gate is coupled to a current mirror 124 in bandgap voltage reference circuit 120. The source of transistor Q3 is connected directly to ground common, while its gate is connected between current mirror 124 and a second current mirror 126.

The gate of an n-channel MOSFET transistor Q5 is connected to the collector of transistor Q2, the source of transistor Q5 is connected directly to ground common, and the drain of transistor Q5 is connected to a node N3. A load such as resistor R1 is connected between node N3 and supply voltage Vdd. Node N3 is also connected to a high gain circuit such as a Schmitt trigger TR1. Schmitt trigger TR1 produces the valid reference signal when supply voltage Vdd is insufficient to assure proper operation of bandgap voltage reference circuit 120. Of course, an inverter may be used in place of Schmitt trigger TR1 if desired, however, Schmitt trigger advantageously prevents oscillation at critical supply voltage levels. Moreover, resistor R1 may be replaced by any load such as a current source or field-effect transistor or similar type device as will be understood by those of ordinary skill in the art.

Analog circuit 104 thus provides a self-generated valid reference signal when the voltage of supply voltage Vdd is at a level sufficient to keep high-gain feedback loop 122 out of an overdrive condition. If the voltage level of supply voltage Vdd is too low, high-gain feedback loop 122 will transition into overdrive. Thus, by comparing the voltages at nodes N1 and N2, the onset of overdrive can be determined by valid reference circuit 150 and translated into a digital valid reference signal.

The high-gain feedback loop 122 in bandgap voltage reference circuit 120 is biased such that node N1 is normally 50 to 70 mV (millivolts) greater than node N2. This differential signal assures that the valid reference signal generated by Schmitt trigger TR1 is switched in one direction while the voltage level of supply voltage Vdd is adequately high. As the voltage level of supply voltage Vdd decreases, the voltages at nodes N1 and N2 will converge causing valid reference circuit 150 to switch, thus indicating that the reference output signal at terminal REF OUT is beginning to decay or becoming unstable.

The voltage difference between nodes N1 and N2 is biased by geometrically adjusting the width to length W/L ratio of transistor Q8 and transistor Q10. Alternatively, the voltage levels of node N1 and node N2 of high-gain feedback loop 122 can remain balanced, and the emitter areas of pnp transistors Q1 and Q2 are adjusted to build in an offset. The unbalancing of the areas of transistors Q1 and Q2 will have a similar effect as biasing the voltage levels at nodes N1 and N2. Of course, both the W/L ratio of transistors Q8 and Q10 as well as the emitter areas of transistors Q1 and Q2 can be adjusted to achieve the desired biasing/offset.

Figure 4:
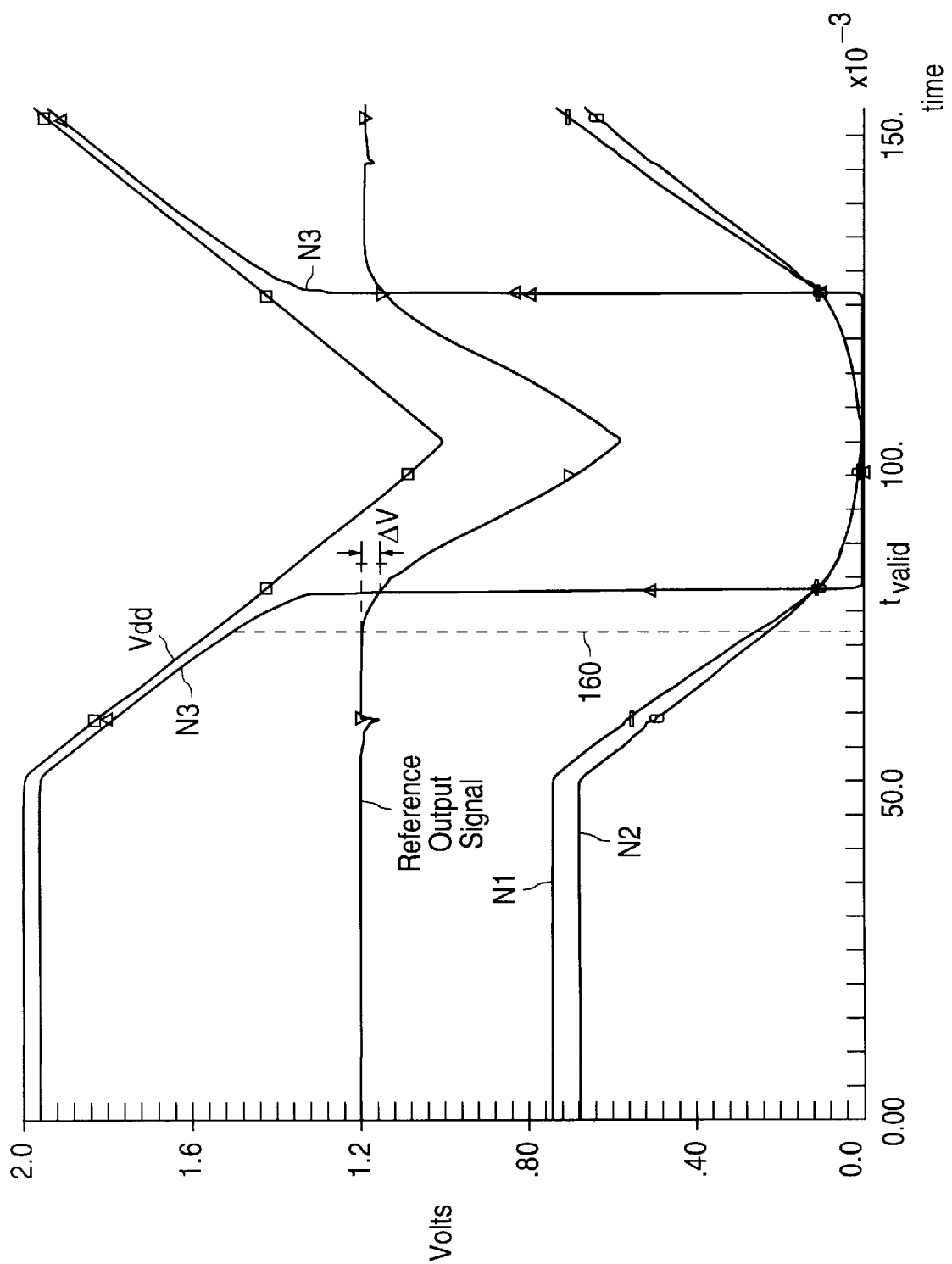
FIG. 4 is a graph showing a simulation of the voltage waveforms of the operation of the valid reference circuit from FIG. 3.

FIG. 4 is a graph of a SPICE simulation showing how a decrease in the voltage level of supply voltage Vdd effects the voltages at nodes N1, N2, and N3 of analog circuit 104 shown in FIG. 3. The Y axis of the graph in FIG. 4 represents voltage with 0.0V representing ground common, while the X axis represents time in milliseconds (ms). As can be seen in FIG. 4, node N1 is biased such that it is approximately 70 mV greater than node N2.

After supply voltage Vdd begins to decrease, the voltages at nodes N1, N2, and N3 begin to decrease. However, as shown in FIG. 4, the voltage at node N1 decreases at a greater rate than the voltage at node N2. Consequently, as supply voltage Vdd decreases, the voltage levels of nodes N1 and N2 converge until they are at the same voltages at time $t_{valid}$. The voltage at node N3 rapidly drops to 0.0V when the voltage levels at nodes N1 and N2 are within a desired range, set by their bias. As shown in FIG. 4, their bias is set so that the voltage at node N3 drops to 0.0V when the voltage levels at nodes N1 and N2 converge, which occurs at time $t_{valid}$.

As illustrated in FIG. 4, the reference output signal at terminal REF OUT (shown in FIG. 3) remains substantially constant as supply voltage Vdd decays. However, by the time the voltages at nodes N1 and N2 converge at time $t_{valid}$, the reference output signal has begun to decay. Consequently, the voltage at node N3, which drops to 0.0V at time $t_{valid}$, can be used to generate the valid reference signal indicating that the voltage level of supply voltage Vdd is no longer adequate to generate a stable reference output signal.

As shown in FIG. 4, however, the reference output signal at terminal REF OUT actually begins to decay slightly before time $t_{valid}$. Consequently, at time $t_{valid}$ the reference output signal has already decayed by an amount $\Delta V$, approximately 0.06V. In some mixed signal systems, a small amount of $\Delta V$ decay may be tolerated. In other mixed signal systems, however, any amount of decay of the reference output signal is intolerable. Accordingly, in some mixed signal systems, it may be desirable to adjust the bias to place an offset in valid reference circuit 150, shown in FIG. 3, such that the voltage at node N3 drops to 0.0V when the voltages at nodes N1 and N2 are within a desired range, e.g., 0.4V. Thus, as indicated by the broken line 160 the voltage at node N3 drops at the beginning of the decay of the reference output signal. Adjusting the bias to place an offset in valid reference circuit 150 so that the voltage at node N3 drops to 0.0V when the voltages at nodes N1 and N2 are within a desired range is well within the knowledge of those of ordinary skill in the art.

It should be understood that mixed signal system 100, shown in FIG. 2, will typically have more than one analog circuit. Where more than one analog circuit is used in mixed signal system 100, mixed signal system 100 may use a separate POR circuit to predict when the other analog circuits are adequately powered. Mixed signal system 100 may alternatively rely on the valid signal generated by analog circuit 104 to predict if the other analog circuits are adequately powered. In another embodiment of the present invention, each additional analog circuit may independently generate its own valid reference signal indicating if it is actually receiving adequate power from the supply voltage to operate properly.

Figure 5:
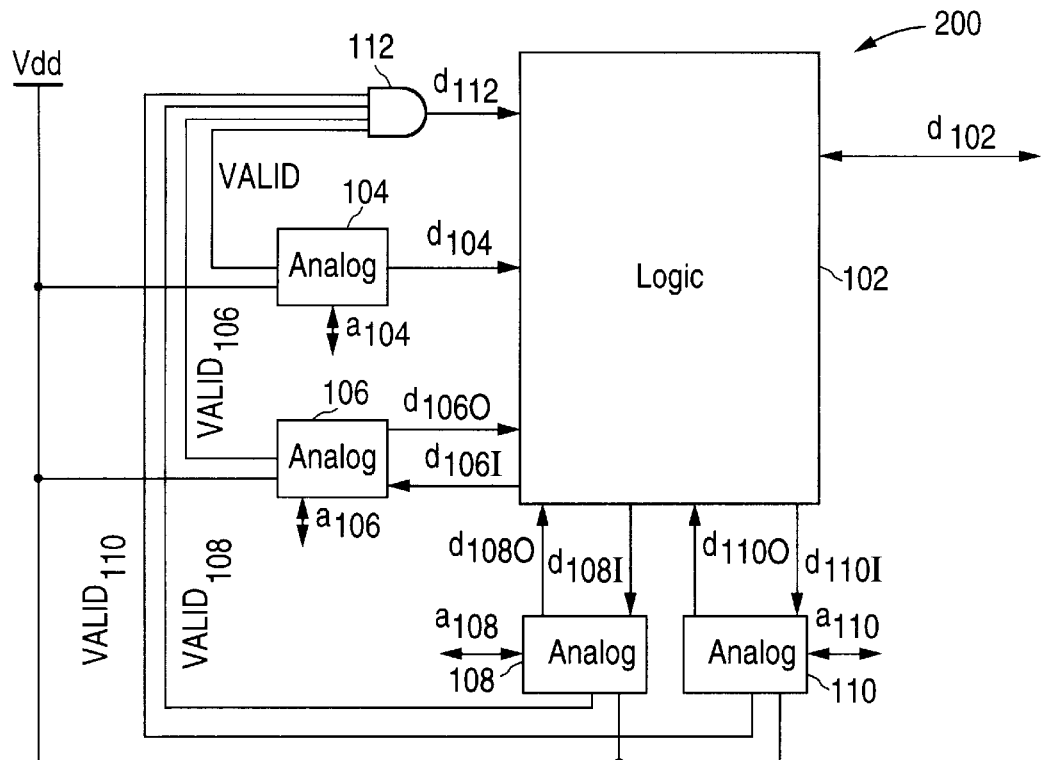
FIG. 5 is a diagram of a mixed signal system, including a logic circuit and four analog circuits, each providing a self-generated valid signal to an AND logic gate in accordance with an embodiment of the present invention.

FIG. 5 is a diagram of a mixed signal system 200 that is similar to mixed signal system 100 (shown in FIG. 2) like designated elements being the same. Mixed signal system 200, however, includes additional analog circuits 106, 108, and 110, each of which produces a self-generated valid signal in accordance with an embodiment of the present invention. Analog circuits 106–110 may be any sub-system components conventionally used in a mixed signal system, for example, a system clock, input/output buffer, amplifier or any other sub-system. Moreover, it should be understood that the number of analog circuits shown in mixed signal system 200 is for illustrative purposes, and that a lesser or greater amount may be used.

As shown in FIG. 5, analog circuits 104–110 transmit or receive respective analog signals $a_{104}$, $a_{106}$, $a_{108}$, and $a_{110}$ to/from external sources (not shown) or to each other, and provide respective digital signals $d_{104}$, $d_{106O}$, $d_{108O}$, and $d_{110O}$ to logic circuit 102. Analog circuits 104–110 may also receive respective digital signals $d_{104}$, $d_{106I}$, $d_{108I}$, and $d_{110I}$ from logic circuit 102. Analog circuits 104–110 are powered by a supply voltage Vdd. Each of analog circuits 104–110 independently detects whether it is receiving sufficient power from supply voltage Vdd to assure proper operation and in response, each of analog circuits 104–110 produces a self-generated valid signal on lines VALID, $\text{VALID}_{106}$, $\text{VALID}_{108}$, and $\text{VALID}_{110}$, respectively.

Analog circuits 104–110 are conventional subsystem components of mixed signal system 200, such as a system clock, an input buffer, or an amplifier. Each of analog circuits 104–110 will have its own independent validity circuit to detect when the supply voltage is adequate to assure proper operation of that analog circuit. Because each of analog circuits 104–110 performs a different function, the validity circuits are individualized for each different analog circuit. Some circuits may produce valid signals by identifying particular nodal voltages internal to the analog circuit that change rapidly at the onset of overdrive of the circuit and translating the event into a logic signal. Thus, a validity circuit may be used that compares nodal voltages that change rapidly when supply voltage Vdd begins to decrease.

Other validity circuits may also be used. For example, if one of analog circuit 106–110 were a system clock, the particular valid reference circuit 150 described in reference to FIG. 3 would not be used. A valid clock signal could be generated by filtering the clock output signal to generate a DC voltage. The filtered clock signal can then be compared to a DC bias voltage. If the system clock is adequately powered, the clock signal will provide an average signal that is greater than the DC bias voltage and a valid clock signal is accordingly generated. However, when the system clock is underpowered, the average signal will be less than the DC bias voltage and the valid clock signal will no longer be generated, or alternatively a clock "invalid" signal will be generated. Each of analog circuits 104–110 will have a different type of validity circuit that determines when the analog circuit is receiving sufficient power from supply voltage Vdd to assure proper operation of that analog circuit. It is well within the knowledge of those skilled in the art to generate a valid signal from different types of analog circuits.

Because each of analog circuits 104–110 produces a separate valid signal, an AND logic gate 112 is used to receive the valid signals, determine when there is a safe power-on state for all the sub-systems, i.e., analog circuits 104–110, and provide an appropriate activation signal to logic circuit 102. Of coarse, the particular illustrated logic gate in mixed signal system 200 represents the functionality of AND logic gate 112, and is not intended to be limiting. Many alternative means of accomplishing the function of AND logic gate 112 will be readily apparent to those having ordinary skill in the art.

Where each of analog circuits 104–110 produces a valid signal, AND logic gate 112 provides an appropriate digital signal to logic circuit 102, indicating that each sub-system is sufficiently powered to safely operate. When an activation signal produced by AND logic gate 112 is received by logic circuit 102, mixed signal system 200 operates in a conventional manner. Where one of the analog circuits 104–110, however, fails to produce a valid signal, e.g., the voltage level of supply voltage Vdd is too low for that analog circuit to properly operate, AND logic gate 112 will not generate an activation signal, or alternatively will generate a deactivation signal. Logic circuit 102 will then be deactivated to prevent the inaccurate or unreliable operation of mixed signal system 200.

By using a valid signal from each sub-system, mixed signal system 200 precisely tracks when all the sub-systems are actually receiving sufficient power from supply voltage Vdd. Consequently, there is no need to predict when a sub-system will no longer be sufficiently powered to properly operate. Because each of analog circuit 104–110 provides its own valid signal, there is no need to predict the affect of possibly different temperature dependencies of analog circuits 104–110 and the system performance is not sacrificed to operate at the lowest possible supply voltage.

Figure 6:
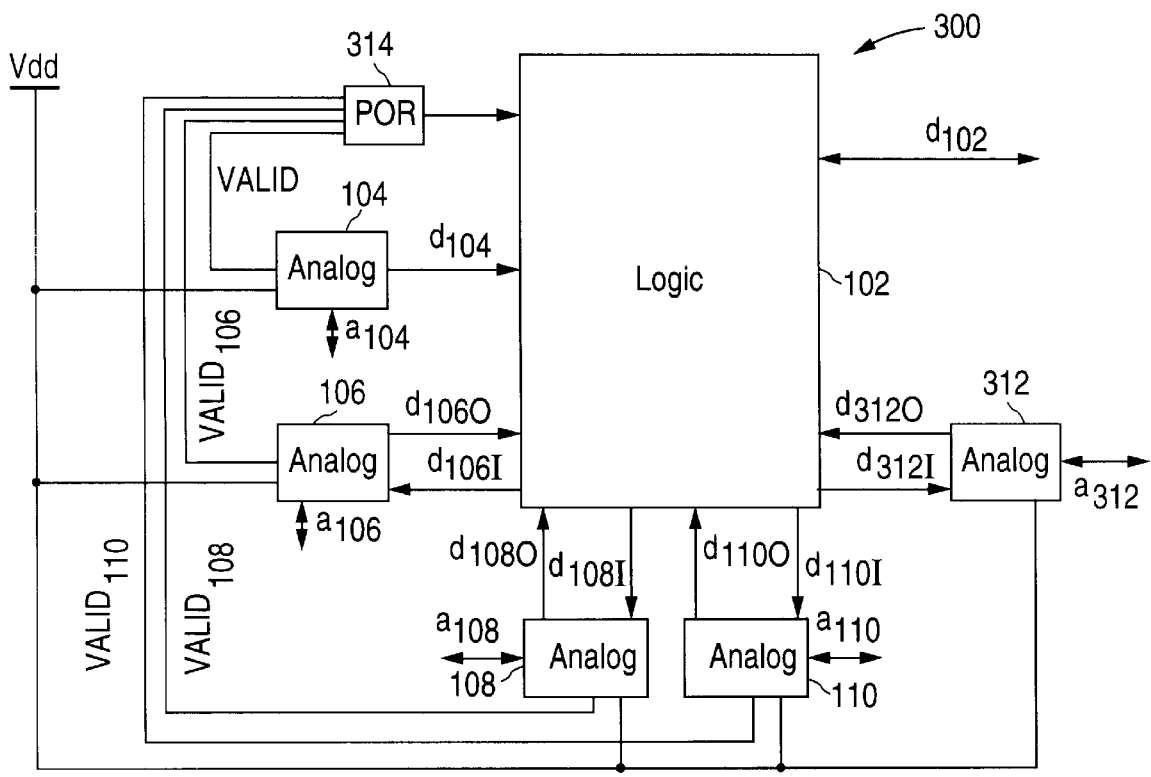
FIG. 6 is a diagram of a mixed signal system including a logic circuit and four analog circuits, and a POR circuit, where the analog circuits provide self-generated valid signals to enable the POR circuit.
Figure 7:
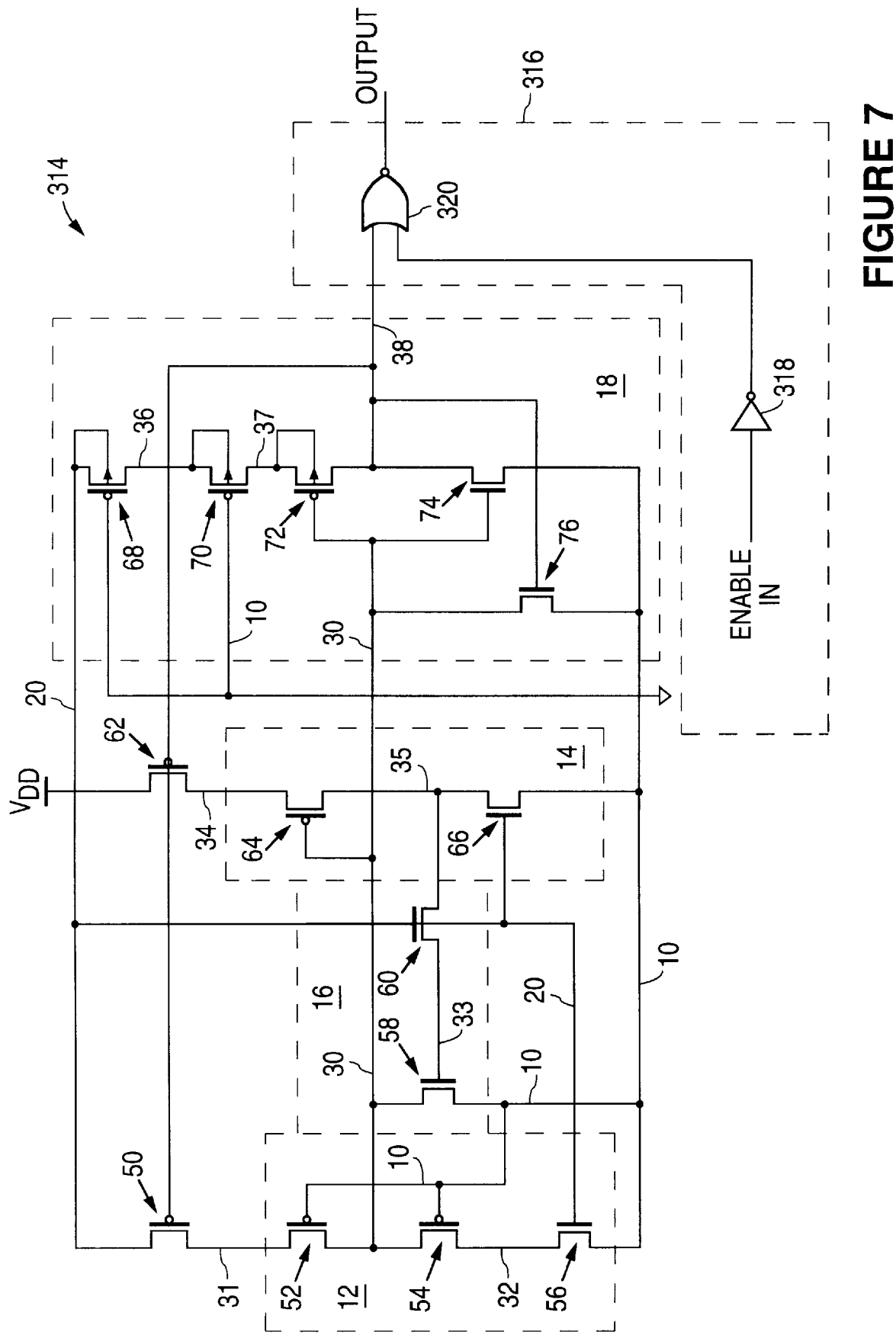
FIG. 7 is a diagram of one embodiment of a POR circuit that may be used in FIG. 6.

FIG. 6 is a diagram of a mixed signal system 300 that is similar to mixed signal system 200 (shown in FIG. 5) like designated elements being the same. Mixed signal system, however, includes an additional analog circuit 312, which does not produce a self-generated valid signal, and a conventional POR circuit 314 that is enabled by the proper valid reference signals. A suitable POR circuit is disclosed, for example, in U.S. Pat. No. 5,323,067 ('067), having the same assignee, and which is incorporated herein by reference. FIG. 7 shows one embodiment of POR circuit 314, which is described in detail in the '067 patent. POR circuit 314 includes an enable input circuit 316. A valid reference signal is received by POR circuit 314 at the terminal ENABLE IN, the signal is inverted at inverter 318 and then received by NOR gate 320, along with the output of POR circuit 316. Of course, if desired, multiple valid reference signals can similarly be received. The output signal of NOR gate 320 is provided to logic circuit 102, as shown in FIG. 6. While FIG. 7 shows one embodiment of POR circuit 314, it should be understood that many alternative POR circuits may also be used. Thus, the present invention is not limited to the precise circuitry shown in FIG. 7, but the present invention may be used in conjunction with any POR circuit.

Analog circuits 104–110 all produce self-generated valid signal on lines VALID, $\text{VALID}_{106}$, $\text{VALID}_{108}$, and $\text{VALID}_{110}$, respectively, and which are received by POR circuit 314. POR circuit 314 is enabled or disabled in response to the valid signals. Analog circuit 312 however, does not produce a valid signal. Consequently, POR circuit 314 is used to predict whether supply voltage Vdd is adequate to power analog circuit 314. Thus, the analog circuits that produce self-generated valid signals may be used in conjunction with analog circuits that do not, and therefore rely on a POR circuit. It should be understood that the number of analog circuits that do not produce valid signals shown in FIG. 6 is illustrative and that a lesser or greater amount may be used. Moreover, if desired only the critical analog circuits may produce self-generated valid signals, while POR circuit 314 is relied upon to predict when the remaining analog circuits are adequately powered.

Although the present invention has been described in considerable detail with reference to certain versions thereof, other versions are possible. For example, different logic gates may be used in place of AND logic gate 112. Also, some components are shown directly connected to one another while others are shown connected via intermediate components. In each instance the method of interconnection establishes some desired electrical communication between two or more circuit nodes. Such communication may often be accomplished using a number of circuit configurations, as will be understood by those of ordinary skill in the art. Therefore, the spirit and scope of the appended claims should not be limited to the description of the versions depicted in the figures.

What is claimed is:

1. A mixed signal circuit comprising:

a logic circuit;

a plurality of analog circuits coupled to said logic circuit and said supply voltage, each of said plurality of analog circuits producing a corresponding valid signal, said corresponding valid signal from each of said plurality of analog circuits indicating when said supply voltage has an adequate voltage level to produce a stable output signal from the corresponding analog circuit and when said supply voltage does not have an adequate voltage level to produce said stable output signal from said corresponding analog circuit; and a logic gate circuit coupled to said logic circuit and said plurality of analog circuits, said logic gate circuit receiving the valid signals from each of said plurality of analog circuits and providing a signal to said logic circuit;

wherein said logic circuit is enabled and disabled in response to said signal from said logic gate circuit.

2. The mixed signal circuit of claim 1, wherein said logic gate circuit is an AND logic gate.

3. The mixed signal circuit of claim 1, wherein at least one of said analog circuits comprises:

a first node and a second node; and a validity circuit coupled to said first node and said second node, said validity circuit detecting when the difference between the voltage levels on said first node and said second node exceeds a threshold, said validity circuit generating said valid signal in response to said voltage levels on said first node and said second node exceeding said threshold.

4. The mixed signal circuit of claim 3, wherein said at least one of analog circuits comprises:

a bandgap voltage reference circuit having a feedback loop, said feedback loop having said first node and said second node; and said validity circuit detecting when said feedback loop transitions into overdrive and in response generating said valid signal.

5. The mixed signal circuit of claim 3, wherein said validity circuit comprises:

a first transistor having a first terminal, a second terminal, and a third terminal, said first terminal coupled to said first node, said second terminal coupled to said supply voltage, said third terminal coupled to a common terminal;

a second transistor having a first terminal, a second terminal, and a third terminal, said first terminal of said second transistor coupled to said second node, said second terminal of said second transistor coupled to said second terminal of said first transistor, said third terminal of said second transistor coupled to said common terminal;

a resistor having a first terminal and a second terminal, said first terminal of said resistor coupled to said supply voltage, said second terminal of said resistor coupled to said common terminal; and a high gain circuit coupled to said second terminal of said resistor, said high gain circuit producing said valid signal.

6. The mixed signal circuit of claim 5, wherein:

said at least one of analog circuits is a bandgap voltage reference circuit having a first current mirror and a second current mirror and a feedback loop having said first node and said second node;

wherein said validity circuit further comprises:

a third transistor disposed between said supply voltage and said first transistor, said third transistor having a first terminal, a second terminal and a third terminal, said first terminal of said third transistor coupled to said first current mirror, said second terminal of said third transistor coupled to said supply voltage, and said third terminal of said third transistor coupled to said second terminal of said first transistor;

a fourth transistor disposed between said second transistor and said common terminal, said fourth transistor having a first terminal, a second terminal and a third terminal, said first terminal of said fourth transistor coupled to said second current mirror, said second terminal of said fourth transistor coupled to said third terminal of said second transistor, said third terminal of said fourth transistor coupled to said common terminal; and a fifth transistor disposed between said resistor and said common terminal, said fifth transistor having a first terminal, a second terminal and a third terminal, said first terminal of said fifth transistor coupled to said third terminal of said second transistor, said second terminal of said fifth transistor coupled to said second terminal of said resistor, said third terminal of said fifth transistor coupled to said common terminal.

7. The mixed signal circuit of claim 6, wherein said resistor is a voltage controlled field-effect transistor.

8. The mixed signal circuit of claim 6, wherein said mived signal circuit is an integrated circuit.

9. A method comprising:

generating individual valid signals from multiple analog circuits, each of said individual valid signals indicating when a supply voltage has a proper voltage level to produce a stable output signal from a corresponding analog circuit of said multiple analog circuits; and providing said individual valid signals to a logic gate circuit, said logic gate circuit producing an enable signal to a logic circuit in response to said individual valid signals.

10. The method of claim 9, wherein said enable signal disables function of said logic circuit when one of said valid signals indicates that said supply voltage does not have said proper voltage level to produce said stable output signal from said at least one analog circuit.

11. The method of claim 9, wherein generating a valid signal in at least one of said analog circuits comprises:

comparing the voltage levels at two nodes in said at least one of said analog circuits; and generating said valid signal when the difference between said voltage levels at two nodes exceeds a threshold.

12. The method of claim 11, wherein said threshold is at least one of a minimum threshold and a maximum threshold.

13. An apparatus comprising:
- a logic circuit;
- a plurality of analog circuits coupled to said logic circuit and a supply voltage, each of said plurality of analog circuits coupled to a respective means for determining whether the voltage level of said supply voltage is adequate for the respective analog circuit to produce a stable output signal, said respective means producing valid signals; and
- wherein said logic circuit is enabled and disabled in response to said valid signals.

14. The apparatus of claim 13, wherein at least one of said respective means for determining whether the voltage level of said supply voltage is adequate to produce said stable output signal from said respective analog circuit is a validity circuit coupled to at least one of said analog circuits, said validity circuit detecting when the difference between the voltage levels at a first node and a second node in said analog circuit exceeds a threshold and in response generating a valid signal.

15. The apparatus of claim 14, wherein said validity circuit comprises:
- a first transistor having a first terminal, a second terminal, and a third terminal, said first terminal coupled to said first node, said second terminal coupled to said supply voltage, said third terminal coupled to a common terminal;
- a second transistor having a first terminal, a second terminal, and a third terminal, said first terminal of said second transistor coupled to said second node, said second terminal of said second transistor coupled to said second terminal of said first transistor, said third terminal of said second transistor coupled to said common terminal;
- a resistor having a first terminal and a second terminal, said first terminal of said resistor coupled to said supply voltage, said second terminal of said resistor coupled to said common terminal; and
- a high gain circuit coupled to said second terminal of said resistor, said high gain circuit producing said valid signal.

16. The mixed signal circuit of claim 15, wherein:
- said analog circuits is a bandgap voltage reference circuit having a first current mirror and a second current mirror and a feedback loop having said first node and said second node;
- wherein said validity circuit further comprises:
  - a third transistor disposed between said supply voltage and said first transistor, said third transistor having a first terminal, a second terminal and a third terminal, said first terminal of said third transistor coupled to said first current mirror, said second terminal of said third transistor coupled to said supply voltage, and said third terminal of said third transistor coupled to said second terminal of said first transistor;
  - a fourth transistor disposed between said second transistor and said common terminal, said fourth transistor having a first terminal, a second terminal and a third terminal, said first terminal of said fourth transistor coupled to said second current mirror, said second terminal of said fourth transistor coupled to said third terminal of said second transistor, said third terminal of said fourth transistor coupled to said common terminal; and
  - a fifth transistor disposed between said resistor and said common terminal, said fifth transistor having a first terminal, a second terminal and a third terminal, said first terminal of said fifth transistor coupled to said third terminal of said second transistor, said second terminal of said fifth transistor coupled to said second terminal of said resistor, said third terminal of said fifth transistor coupled to said common terminal.

17. The apparatus of claim 13, wherein said respective means for determining whether the voltage level of said supply voltage is adequate for the respective analog output circuit to produce said stable output signal comprises:
- said plurality of analog circuits coupled to a corresponding plurality of validity circuits, each of said plurality of validity circuits detecting when the voltage level of said supply voltage is inadequate to maintain a linear output signal of one of the analog circuits in said plurality of analog circuits and in response generating a valid signal; and
- said apparatus further comprises:
  - a logic gate circuit coupled to said logic circuit and said plurality of validity circuits, said logic gate circuit receiving the valid signals from said plurality of validity circuits and providing a signal to enable and disable said logic circuit in response to said valid signals.

18. The apparatus of claim 13, wherein said respective means for determining whether the voltage level of said supply voltage is adequate for the respective analog output circuit to produce said stable output signal comprises:
- said plurality of analog circuits coupled to a corresponding plurality of validity circuits, each of said plurality of validity circuits detecting when the voltage level of said supply voltage is inadequate to maintain a linear output signal of one of the analog circuits in said plurality of analog circuits and in response generating a valid signal; and
- said apparatus further comprises:
  - a power on reset circuit coupled to said logic circuit.

* * * * *